(12) United States Patent
Winters et al.

(10) Patent No.: US 7,030,553 B2
(45) Date of Patent: Apr. 18, 2006

(54) OLED DEVICE HAVING MICROCAVITY GAMUT SUBPIXELS AND A WITHIN GAMUT SUBPIXEL

(75) Inventors: Dustin Winters, Webster, NY (US);
Yuan-Sheng Tyan, Webster, NY (US);
Steven A. Van Slyke, Pittsford, NY (US); Ronald S. Cok, Rochester, NY (US); Andrew D. Arnold, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 251 days.

(21) Appl. No.: 10/643,837

(22) Filed: Aug. 19, 2003

(65) Prior Publication Data

US 2005/0040756 A1    Feb. 24, 2005

(51) Int. Cl.
*H01J 1/62* (2006.01)
*H01J 63/04* (2006.01)
*H05B 33/00* (2006.01)

(52) U.S. Cl. .................. 313/504; 313/506; 313/113
(58) Field of Classification Search ........ 313/503–506, 313/512, 113, 114; 315/169.3; 428/917; 345/36, 45, 76
See application file for complete search history.

(56) References Cited

U.S. PATENT DOCUMENTS

| | | | |
|---|---|---|---|
| 4,356,429 A | 10/1982 | Tang | |
| 5,276,380 A | 1/1994 | Tang | |
| 5,283,182 A | 2/1994 | Powell et al. | |
| 5,405,709 A | 4/1995 | Littman et al. | |
| 5,503,910 A | 4/1996 | Matsuura et al. | |
| 5,550,066 A | 8/1996 | Tang et al. | |
| 5,683,823 A | 11/1997 | Shi et al. | |
| 5,780,174 A | 7/1998 | Tokito et al. | |
| 6,281,634 B1 | 8/2001 | Yokoyama | |
| 6,406,801 B1 | 6/2002 | Tokito et al. | |
| 6,456,013 B1 | 9/2002 | Komiya et al. | |
| 6,812,637 B1* | 11/2004 | Cok et al. ................. | 313/503 |

(Continued)

FOREIGN PATENT DOCUMENTS

EP        0616488        9/1994

(Continued)

OTHER PUBLICATIONS

Djurisic et al, Organic microcavity light-emitting diodes with metal mirrors: dependence of the emission wavelength on the viewing angle, Applied Optics vol. 41, No. 36, Dec. 2002, pp. 7650-7656.

*Primary Examiner*—Ashok Patel
(74) *Attorney, Agent, or Firm*—Raymond L. Owens (57) ABSTRACT

An OLED device including an array of light emitting pixels, each pixel including subpixels having organic layers including at least one emissive layer that produces light and spaced electrodes, and wherein there are at least three gamut subpixels that produce colors which define a color gamut and at least one subpixel that produces light within the color gamut produced by the gamut subpixels; and wherein at least one of the gamut subpixels includes a reflector and a semitransparent reflector which function to form a microcavity.

17 Claims, 4 Drawing Sheets

U.S. PATENT DOCUMENTS

| | | |
|---|---|---|
| 6,903,378 B1 * | 6/2005 | Cok .......................... 257/88 |
| 2002/0025419 A1 | 2/2002 | Lee et al. |
| 2002/0186214 A1 | 12/2002 | Siwinski |
| 2003/0107314 A1 | 6/2003 | Urabe et al. |
| 2004/0056590 A1 * | 3/2004 | Lim et al. .................. 313/506 |
| 2004/0113875 A1 * | 6/2004 | Miller et al. ................. 345/82 |
| 2004/0217694 A1 * | 11/2004 | Cok et al. .................. 313/504 |

FOREIGN PATENT DOCUMENTS

| | | |
|---|---|---|
| EP | 1182244 | 2/2002 |
| EP | 1187235 | 3/2002 |
| GB | 2349979 | 11/2000 |
| JP | 11-288786 | 10/1999 |
| JP | 2000068069 | 3/2000 |
| WO | WO 00/11728 | 3/2000 |

\* cited by examiner

OLED DEVICE HAVING MICROCAVITY GAMUT SUBPIXELS AND A WITHIN GAMUT SUBPIXEL

CROSS-REFERENCE TO RELATED APPLICATIONS

Reference is made to commonly-assigned U.S. Publication No. 2004/0140757, published Jul. 22, 2004, entitled "Microcavity OLED Devices" by Tyan et al, U.S. Publication No. 2004/0149984, published Aug. 5, 2004, entitled "Color OLED Display with Improved Emission" by Tyan et al, U.S. Pat. No. 6,861,800, issued Mar. 1, 2005, entitled "Tuned Microcavity OLED Display" by Tyan et al, U.S. patent application Ser. No. 10/412,534, filed Apr. 11, 2003, entitled "A Color OLED Display With Improved Power Efficiency" by Arnold et al and U.S. Pat. No. 6,919,681 issued Jul. 19, 2005, entitled "A Color OLED Display With Improved Power Efficiency" by Cok et al, the disclosures of which are incorporated herein.

FIELD OF INVENTION

This invention relates to microcavity organic electroluminescent (EL) devices.

BACKGROUND OF THE INVENTION

Full color organic electroluminescent (EL), also known as organic light-emitting devices or (OLED), have been recently been demonstrated as a new type of flat panel display. In simplest form, an organic EL device is comprised of an anode for hole injection, a cathode for electron injection, and an organic EL medium sandwiched between these electrodes to support charge recombination that yields emission of light. An example of an organic EL device is described in commonly-assigned U.S. Pat. No. 4,356,429. In order to construct a pixilated display device such as is useful, for example, as a television, computer monitor, cell phone display or digital camera display, individual organic EL elements may be arranged as an array of pixels in a matrix pattern. To produce a multi-color display, the pixels are further arranged into subpixels, with each subpixel emitting a different color. This matrix of pixels can be electrically driven using either a simple passive matrix or an active matrix driving scheme. In a passive matrix, the organic EL layers are sandwiched between two sets of orthogonal electrodes arranged in rows and columns. An examples of a passive matrix driven organic EL devices is disclosed in commonly-assigned U.S. Pat. No. 5,276,380. In an active matrix configuration, each pixel is driven by multiple circuit elements such as transistors, capacitors, and signal lines. Examples of such active matrix organic EL devices are provided in U.S. Pat. No. 5,550,066 (commonly-assigned); U.S. Pat. Nos. 6,281,634 and 6,456,013.

Full color OLED devices are also known in the art. Typical full color OLED devices are constructed of pixels having three subpixels that are red, green, and blue in color. Such an arrangement is known as an RGB design. An example of an RGB design is disclosed in U.S. Pat. No. 6,281,634. Full color organic electroluminescent (EL) devices, have also recently been described that are constructed of pixels having four subpixels that are red, green, blue, and white in color. Such an arrangement is known as an RGBW design. An example of an RGBW device is disclosed in commonly-assigned U.S. Patent Publication 2002/0186214A1. In an RGBW device, a high efficiency white emitting pixel is used to display a portion of the digital image content. This results in improved power consumption relative to an RGB constructed of similar OLED materials. However, the red, green, and blue subpixels do not improved in efficiency in this design. Therefore, no power savings are achieved for displaying any portion of the digital image content that is pure red, pure blue, or pure green in color such as, for example, icons and toolbars commonly used in many personal digital assistant (PDA), cell phone, or digital camera applications. Furthermore, the addition of the fourth subpixel results in all red, green, and blue subpixels having to be made small to fit the same total number of subpixels per unit area and achieve the same device pixel resolution as a comparable RGB device. This results in the current density per unit area of the associated red, green, and blue subpixels having to be increased in order to display the same brightness for this pure red, pure blue, or pure green content. It is known that OLED devices degrade, or become less efficient, more quickly as current density is increased. For an RGBW display, this may result in content which is pure red, pure green, or pure blue, and appearing frequently such as, for example, icons and toolbars causing image burn-in quicker than in an equivalent RGB display and therefore overall device lifetime is reduced.

Therefore, an RGBW device with improved efficiency and lifetime for the red, green, and blue subpixels is desired.

SUMMARY OF THE INVENTION

It is an object of the present invention to make use of an OLED display device that has pixels having gamut subpixels and within gamut subpixels that can substantially improve the efficiency of the gamut subpixels.

This object is achieved by an OLED device comprising:

(a) an array of light emitting pixels, each pixel including subpixels having organic layers including at least one emissive layer that produces light and spaced electrodes, and wherein there are at least three gamut subpixels that produce colors which define a color gamut and at least one subpixel that produces light within the color gamut produced by the gamut subpixels; and (b) wherein at least one of the gamut subpixels includes a reflector and a semitransparent reflector which function to form a microcavity.

By constructing a gamut subpixels with a microcavity structure the present invention provides improved efficiency and lifetime. It is a further advantage that such a device can be constructed using a common OLED organic layers for all subpixels which does not require precision patterning to from the subpixels. It is a further advantage that such a device can be constructed without the need for color filter elements, which thereby lowers cost.

DETAILED DESCRIPTION OF THE INVENTION

Figures 1, 1B:
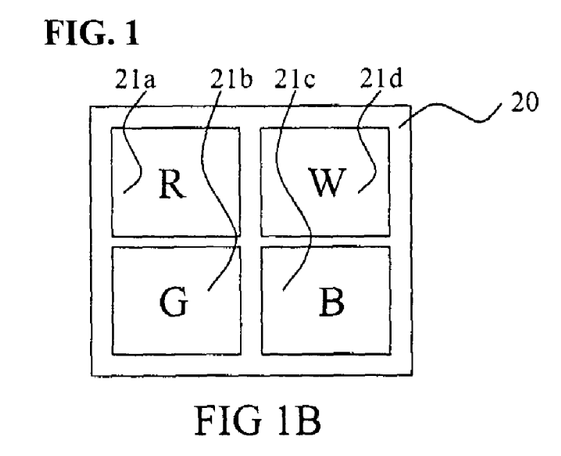
FIGS. 1a–d depict RGBW pixel pattern layouts that can be used in accordance with the present invention.

RGBW displays are one example of a type of display that utilizes within-gamut emission to improve power consumption. Such display devices are capable of displaying color images through the use of pixels having at least four different color subpixels. At least three of the subpixels are gamut subpixels that emit different colors, which define the color gamut of the display. For example, gamut subpixels might emit light that is either Red, Green, or Blue in color. By illuminating two or more of the gamut subpixels to varying intensities, other colors can be generated. These new colors are within-gamut colors. Such a display device also has at least one additional subpixel that is a within-gamut subpixel, which emits a within-gamut color light such as white. The term white is used in the present invention to indicate any light emission which is perceived as approximately white to a viewer. These within-gamut subpixels generally are more efficient than the gamut subpixels. FIG. 1 illustrates example pixel configurations for an RGBW device.

Figure 1A:
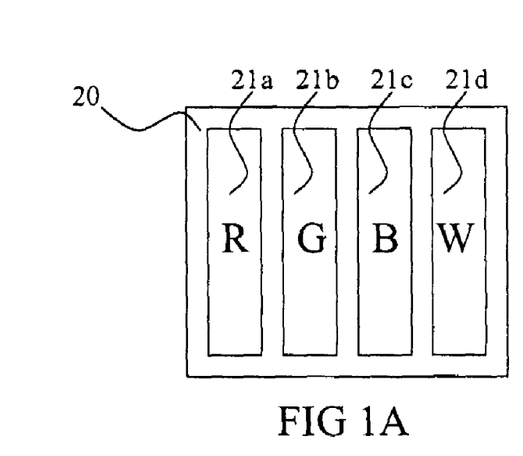

FIG. 1a shows a stripe pattern configuration of an RGBW device pixel 20. Pixel 20 includes gamut subpixels 21a, 21b, and 21c as well as within gamut pixel 21d. These subpixels can have, for example, the colors Red (R), Green (G), Blue (B), and White (W) respectively.

FIG. 1b shows a quad pattern configuration of an RGBW device pixel 20. Pixel 20 includes gamut subpixels 21a, 21b, and 21c as well as within gamut pixel 21d. These subpixels can have, for example, the colors Red (R), Green (G), Blue (B), and White (W) respectively.

Figure 1C:
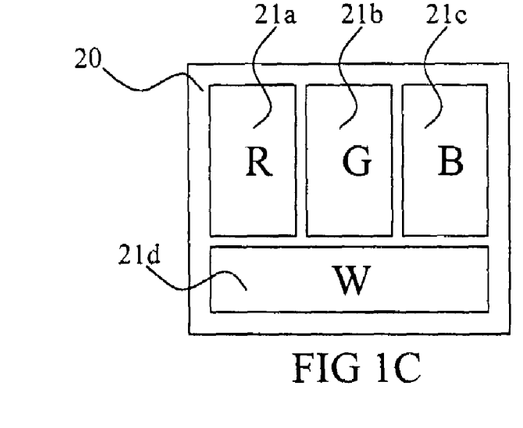

FIG. 1c shows another pattern configuration of an RGBW device pixel 20. Pixel 20 includes gamut subpixels 21a, 21b, and 21c as well as within gamut pixel 21d. These subpixels can have, for example, the colors Red (R), Green (G), Blue (B), and White (W) respectively.

Figure 1D:
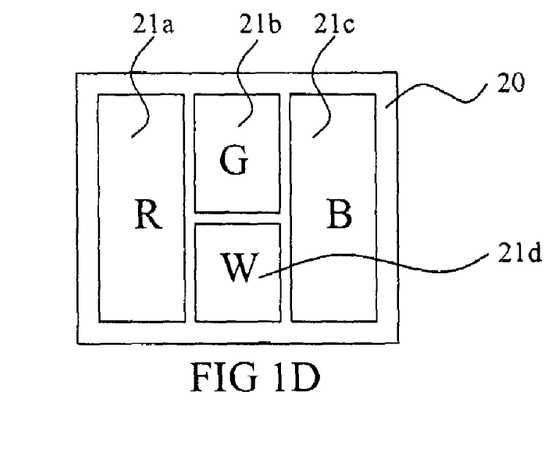

FIG. 1d shows another pattern configuration of an RGBW device pixel 20. Pixel 20 includes gamut subpixels 21a, 21b, and 21c as well as within gamut pixel 21d. These subpixels can have, for example, the colors Red (R), Green (G), Blue (B), and White (W) respectively.

Other patterns of RGBW can be applied to the present invention. Furthermore, patterns with more than 4 subpixels can also be applied. While in the above mentioned examples, the subpixels are shown to be arranged in a certain order, the subpixels can be arranged in other embodiments having different orders. Furthermore, while the subpixels are shown as being all the same size and shape, those skilled in the art will recognize that other embodiments can have subpixels with differing sizes and shapes.

This type of display is more efficient than conventional OLED displays because the with-gamut subpixels tend to have higher efficiency than at least one of the gamut subpixels. Typically, the within gamut subpixel is more efficient than all of the gamut subpixels. Each subpixel can be fabricated using a separate OLED material designed to emit a different color light. However, a preferred configuration uses a common broadband or white emitting OLED material common to all subpixels. The use of a broadband or white emitting OLED material eliminates the need to pattern the OLED materials for each pixel. In this case, color filters could be used for some of the subpixels to convert a broadband or white emission to individual colors. For example, red, green, and blue color filters could be used in the gamut subpixels of RGBW devices to form red, green, and blue colors and the within-gamut subpixel is left unfiltered to emit white. Because the within-gamut subpixel does not have a filter, it is more efficient than the gamut subpixels.

Figure 2:
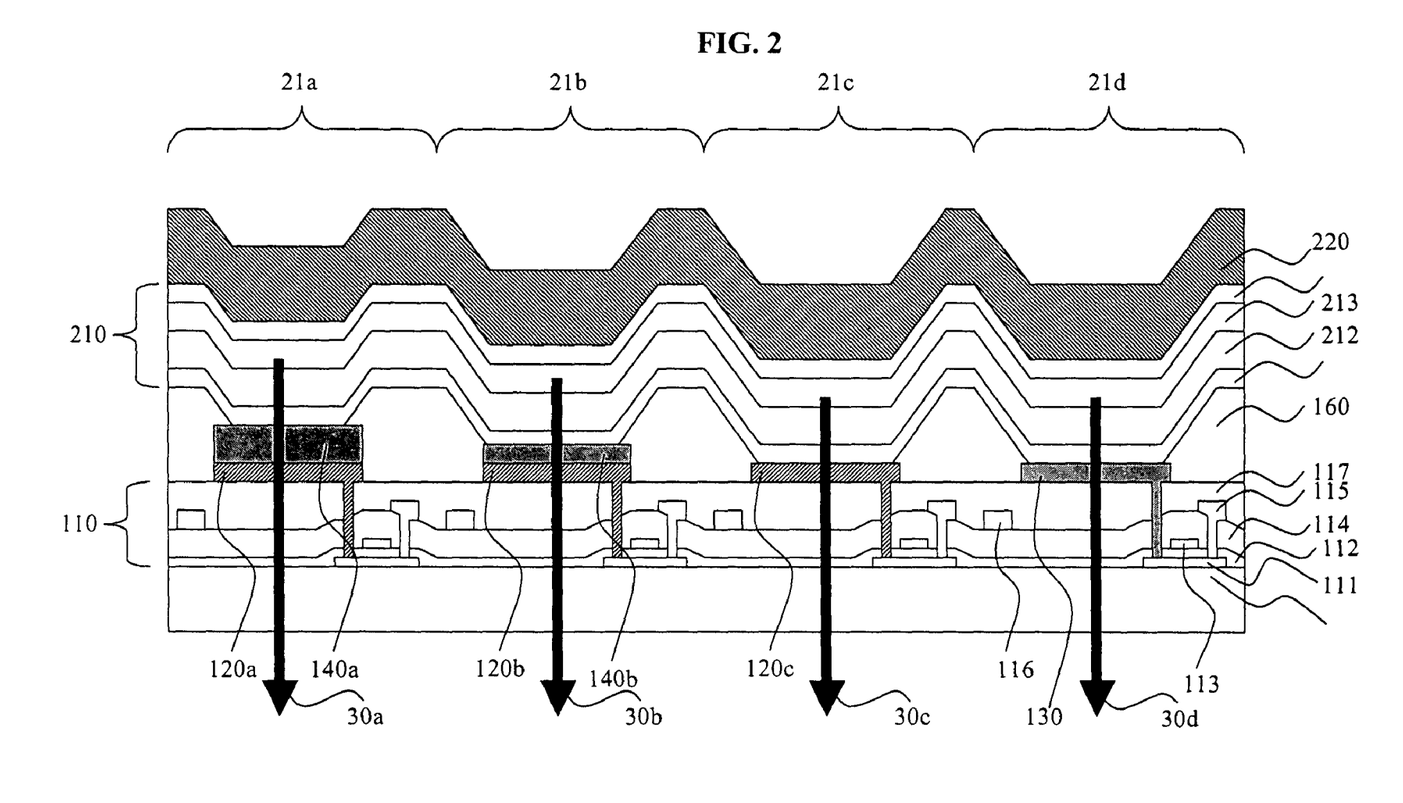
FIG. 2 depicts a cross sectional view of a pixel according to an embodiment of the present invention.

FIG. 2 shows the cross section of one pixel of a device according to the present invention having, for example, a stripe pattern with three gamut subpixels 21a, 21b, and 21c and one within-gamut subpixel 21d. These subpixels emit light 30a, 30b, and 30c, which have gamut colors and light 30d, which has a within-gamut color. The device shown in FIG. 2 is shown to be active matrix with active matrix circuitry 110, however, alternate embodiments which are passive matrix which do not have active matrix circuitry can be applied to the present invention FIG. 2 also shows a configuration that is bottom emitting, that is where light (30a, 30b, 30c, and 30d) is extracted in the direction of the substrate. Gamut subpixels 21a, 21b, and 21c are formed using a microcavity structure. Microcavity structures are formed using a reflector and semi-transparent reflector. The organic EL medium is formed between the reflector and the semi-transparent reflector. The layers between the reflector and the semi-transparent reflector create an optical cavity, which is then adjusted in thickness and refractive index to resonate at a desired wavelength. Examples of microcavity structures are shown in (U.S. Pat. Nos. 6,406,801 B1; 5,780,174 A1, and JP 11288786). Preferred materials for the reflector that are highly reflective include Ag, Al, Au or alloys composed of one or more of these materials. The semi-transparent reflector is partially reflective and partially transmissive. Preferred materials for the semi-transparent reflector include Ag, Au or alloys composed of one or both of these materials. These materials have a thickness selected to cause them to be semi-transparent, that is partially transmitting and partially reflective. This thickness may be in the range of, for example, between 5 nm and 50 nm, and is more preferably between 15 nm and 30 nm. If conductive material are used to form the reflector or the semi-transparent reflector, then the reflector, the semi-transparent reflector, or both, can also serve the function of an electrode, either the anode or the cathode, for the organic EL medium. An alternate semi-transparent reflector structure composed of a quarter wave stack (QWS) of transparent materials with alternating high and low refractive indexes is also known and can be applied to the present invention by someone skilled in the art In a bottom emission configuration, such as shown, where the light is viewed through the substrate, the semi-transparent reflector is located between the organic EL layers and the substrate and the reflector is located above the substrate, the semi-transparent reflector, and the organic EL layers. Alternately, in a top emission configuration, that is where the light is viewed in the direction opposite the substrate, the reflector is located between the organic EL layers and the substrate and the semi-transparent reflector is located above the substrate, the reflector, and the organic EL layers.

The active matrix circuitry 110 is formed above a substrate 100. Active matrix circuitry 110 includes a first thin film transistor (TFT) comprised of a semiconductor active layer 111, a gate dielectric 112, a gate conductor 113, a first insulating layer 114, and a second insulating layer 117. Active matrix circuitry 110 further includes one signal line 116 that carries the luminance signal and one power line 115 to supply power to the transistor. Methods of fabricating the TFT Circuitry are well known in the art. While only a single transistor, signal line, and power line are shown for each subpixel, typically, each subpixel also has a second transistor (not shown) as well as a capacitor (not shown) and additional select lines (not shown). Many types of circuits having different numbers and configurations of circuit components are known in the art and it is understood that a wide variety of these circuits will work with this invention. Examples of active matrix configurations include U.S. Pat. Nos. 5,550,066; 6,281,634, and 6,501,466. While, the TFTs shown are fabricated with a thin film semiconductor active layer 111, it is understood that with semiconducting substrates, the substrate may actually serve this function. A top gate structure, that is where the gate conductor 113 and the gate dielectric 112 are above the semiconductor active layer 111, is shown, however, it is also known in the art that TFTs with an inverse structure known as bottom gate can be used to drive organic EL devices.

Above the active matrix circuitry, semi-transparent reflectors 120a, 120b, and 120c are formed in gamut subpixel 21a, 21b, and 21c respectively. These semi-transparent reflectors 120a, 120b, and 120c can be formed of a reflective metal such as Ag, Au, Al, and alloys thereof, which are made to be thin so as to also be semi-transparent. It is possible, although not required that the semi-transparent reflector also serves as one of the electrodes for the organic EL media.

The within-gamut subpixel 21d does not have a semi-transparent reflector but instead has only a transparent electrode 130. The transparent electrode 130 is typically constructed of a metal oxide such as, but not limited to, indium-tin oxide (ITO), zinc-tin oxide (ZTO), tin-oxide (SnOx), indium oxide (InOx), molybdnum oxide (MoOx), tellurium oxide (TeOx), antimony oxide (SbOx), and zinc oxide (ZnOx). Transparent electrode 130 is also electrically connected down to the active matrix components either directly as shown or with an intermediate conductor. The use of a transparent electrode without a semi-transparent reflector results in the within-gamut subpixel not having a microcavity structure.

For gamut subpixel 21a, transparent cavity-spacer layer 140a is formed above semi-transparent reflector 120a. The transparent cavity-spacer layer 140a can be constructed of a metal oxide such as, but not limited to, indium-tin oxide (ITO), zinc-tin oxide (ZTO), tin-oxide(SnOx), indium oxide (InOx), molybdnum oxide (MoOx), tellurium oxide (TeOx), antimony oxide (SbOx), and zinc oxide (ZnOx). In this case the transparent cavity-spacer layer 140a also serves as an electrode for the organic EL media 210 so that transparent cavity-spacer layer 140a must be electrically connected down to the active matrix components. This can be achieved either directly or if the semi-transparent reflector 120a is of a conducting material such as Ag, Al, Au or alloys thereof, through the semi-transparent reflector 120a as shown or with other intermediate conductors. If transparent cavity-spacer layer 140a is not conductive, then the semi-transparent reflector 120a can serve as the electrode for the organic EL media 210, and would therefore be connected down to the active matrix circuitry 110. Alternately, the transparent electrode 130, transparent cavity spacer layer 140a, and semi-transparent reflector 120a could be formed of three (or more) different layers in which case the transparent electrode would be in electrical contact with the active matrix circuitry and the cavity-spacer layer could be between the transparent electrode and the semi-transparent reflector. The thickness and index of refraction of transparent cavity-spacer layer 140a is optimized in conjunction with the thickness and index of refraction of the organic EL media 210 in order to tune the cavity to resonate at the wavelength desired for the color of light for subpixel 21a, for example red. Tuning thickness and refractive index to achieve the desired microcavity emission is well known in the art.

Gamut subpixel 21b is similarly constructed using cavity-spacer layer 140b above semi-transparent reflector 120b. In this case, the thickness and index of refraction of cavity-spacer layer 140b is optimized in conjunction with the thickness and index of refraction of the organic EL media 210 in order to tune the cavity to resonate at a different wavelength desired for the color of light for subpixel 21b, for example green.

Gamut subpixel 21c is shown here as not having a cavity-spacer layer. In this case, only the thickness and index of refraction of the organic EL media 210 is optimized in order to tune the cavity to resonate at a different wavelength desired for the color of light for subpixel 21c, for example blue. If the organic EL media 210 is common to all subpixels, as shown, then organic EL media 210 is optimized only for this gamut subpixel, and the other gamut subpixels are separately tuned using their respective cavity-spacer layers. This configuration minimizes the number of different cavity-spacer layers which need to be deposited and patterned. However, in an alternate embodiment, all gamut subpixels could include a cavity-spacer layer with each separately optimized to tune to the desired colors. Use of these above mentioned cavity spacer layer is preferred in order to allow the organic EL media 210 to be deposited without patterning for each subpixel. However, in an alternate embodiment, one or more of the organic layers of the organic EL media can be pattered and separately adjusted in thickness or refractive index to tune the microcavity of each of the gamut subpixels. In this configuration, the cavity space layer can be used or eliminated. However, this requires precision patterning of at least one of the organic layers.

As described above, in order to minimize the number of deposition steps and patterning steps, one of the gamut subpixels may have no cavity-spacer layer. Another preferred method to reduce the number of deposition and patterning steps is to use the same material, thickness, and refractive index to form one of the cavity-spacer layers, for example, cavity-spacer layer 140b and the transparent electrodes of the non-gamut subpixels, for example transparent electrode 130.

An interpixel dielectric layer 160, as such as is described in U.S. Pat. No. 6,246,179, is preferably used to cover the edges of the transparent electrodes to prevent shorts or strong electric fields in this area. The interpixel dielectric layer 160 can also cover the cavity spacer as shown if the cavity spacer is conductive or forms part of the electrode. While use of the interpixel dielectric layer 160 is preferred, it is not required for successful implementation of the present invention.

Each of the subpixels further includes organic layers forming an organic EL media 210. There are numerous configurations of the organic EL media 210 layers wherein the present invention can be successfully practiced. Examples of organic EL media layers that emit broadband or white light are described, for example, in commonly-assigned EP 1 187 235, U.S. Patent Publication No. 20020025419 (commonly-assigned), EP 1 182 244, U.S. Pat. No. 5,683,823 (commonly-assigned); U.S. Pat. Nos. 5,503,910; 5,405,709 (commonly-assigned), and U.S. Pat. No. 5,283,182. As shown in commonly-assigned EP 1187235A2, a white emitting organic EL media can be achieved by the inclusion of the following layers; a hole injecting layer 211, a hole transporting layer 212 that is disposed over the hole injecting layer 211 and is doped with a rubrene compound for emitting light in the yellow region of the spectrum, a light emitting layer 213 doped with a blue light-emitting compound disposed over the hole transporting layer 212, and an electron transporting layer 214 disposed over the light emitting layer 213. Alternate embodiments where one or more different organic EL media materials are used for different subpixels can also be applied to the present invention.

Above the organic EL media 210, the reflector 220 is formed. The reflector 220 can be formed of materials such as Al, Ag, Au, or alloys thereof. The reflector 220 can also serve as the second electrode for the organic EL media 210.

While the transparent cavity spacers are shown here as being between the semi-transparent reflectors and the organic EL media, in alternate embodiments, the cavity step spacers can be formed instead between the organic EL media and the reflector.

In another alternate embodiment where one or more of the layers of the organic EL media 210 is not common to all subpixels but is instead individually patterned for each subpixel, then the cavity-spacer layers can be eliminated and the microcavity for the gamut subpixels can be tuned by tuning the thickness, refractive index, or both of one or more of the layers forming the organic EL media 210 separately for each gamut subpixel. In this case, if the organic EL media 210 is designed to emit broadband light, it may be preferable to use the same thickness for one or more of the organic EL media 210 layers for the within-gamut subpixels and one or more of the gamut subpixels to minimize the number of deposition steps.

Figure 3:
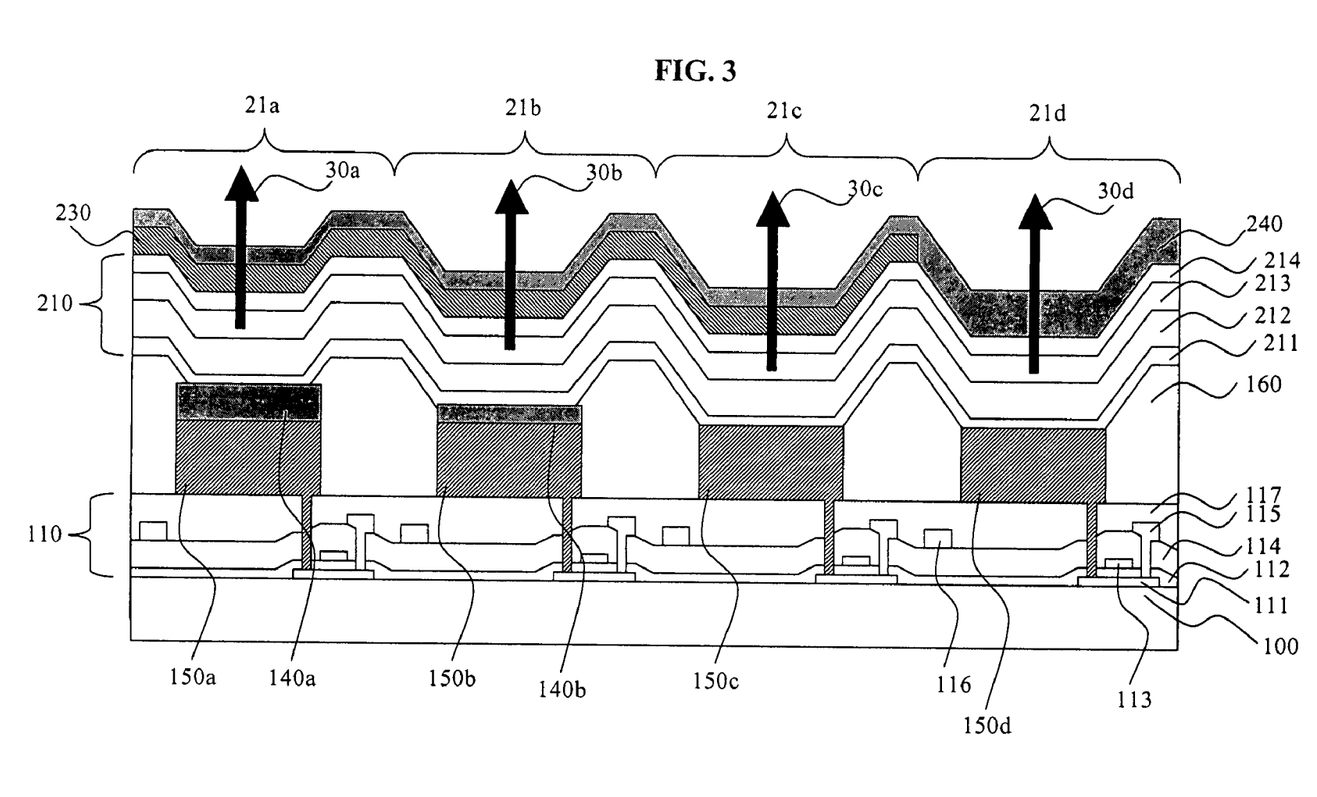
FIG. 3 depicts a cross sectional view of a pixel according to an another embodiment of the present invention.

FIG. 3 shows a cross section of a further embodiment of the present invention, which is top emitting, that is where light (30a, 30b, 30c, and 30d) is extracted in the direction away from the substrate. In order to realize this top emitting configuration, reflectors 150a, 150b, 150c, and 150d are located between the organic EL media 210 and the substrate 100. These reflectors 150a, 150b, 150c, and 150d can be formed of materials such as Ag, Au, Al, or alloys thereof. These reflectors 150a, 150b, 150c, and 150d can also serve as an electrode for the organic EL media 210 as shown in which case it must be connected down to the active matrix circuitry. In this embodiment, the semi-transparent reflector 230 must be formed above organic EL media 210 forth gamut subpixels 21a, 21b, and 21c. However, the semi-transparent reflector 230 must patterned so as to not be present in the within-gamut subpixel 21d. A transparent electrode 240 must be used over the within-gamut subpixel 21d. The transparent electrode can also be present over the other subpixels as shown to reduce the need for patterning, although this is not required. The transparent electrode 240 could be constructed of a metal oxide such as, but not limited to, indium-tin oxide (ITO), zinc-tin oxide (ZTO), tin-oxide (SnOx), indium oxide (InOx), molybdnum oxide (MoOx), tellurium oxide (TeOx), antimony oxide (SbOx), and zinc oxide (ZnOx).

While in FIG. 3, the reflectors (150a, 150b, 150c, and 150d) form one electrode for the organic EL media 210, in an alternate embodiment, a separate electrode could be formed over the reflector and below the organic EL media 210, which then becomes part of the microcavity cavity for the gamut subpixels 21a, 21b, and 21c. This electrode could be constructed of a metal oxide such as, but not limited to, indium-tin oxide (ITO), zinc-tin oxide (ZTO), tin-oxide (SnOx), indium oxide (InOx), molybdnum oxide (MoOx), tellurium oxide (TeOx), antimony oxide (SbOx), and zinc oxide (ZnOx).

While the transparent electrode 240 is shown in FIG. 3 as being above the semi-transparent reflector 230, in another alternate embodiment, it could be located between the semi-transparent reflector 230 and the organic EL media 210. In this case, the transparent electrode 240 would form one of the electrodes for the organic EL media 210 for all the subpixels and become part of the microcavity cavity.

Figure 4:
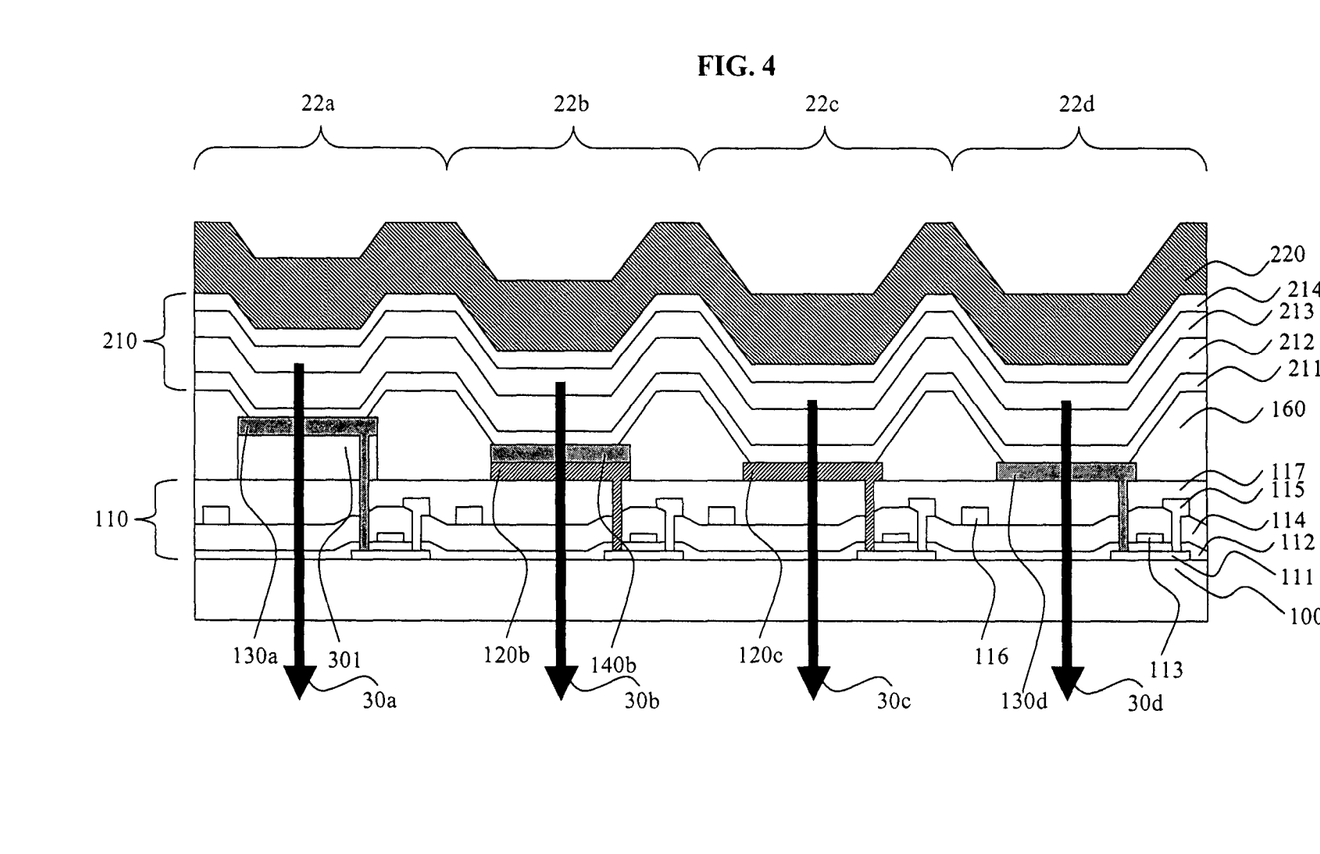
FIG. 4 depicts a cross sectional view of a pixel according to another embodiment of the present invention.

The embodiments described above illustrate examples where the efficiency and lifetime of the all gamut subpixels have been improved by using microcavity while still maintaining the ability to generate broadband or white emission from the within-gamut subpixels. However, other embodiments are possible whereby only some of the gamut subpixels are improved by using a microcavity structure. That is, some of the gamut subpixels are not constructed as to form a microcavity. An example of such a configuration is shown if FIG. 4 which has two microcavity gamut subpixels 22b and 22c, one non-microcavity gamut subpixel 22a and a within-gamut subpixel 22d. In this case, non-microcavity gamut subpixel 22a, is formed using a reflector 220 and a transparent electrode 130a. The transparent electrode can be of the same material and thickness as used for the transparent electrode 130d of the within-gamut subpixel 22d. If the organic EL media 210 used is white or broadband emitting, then a color filter 301 may be used to achieve the desired gamut color for these subpixels. The use of color filters to convert broadband emission to narrow band emissions of a specific color is known in the art. As long as at least one of the gamut subpixels is constructed as a microcavity, then some improvement in lifetime and efficiency will be realized according to the present invention.

The invention has been described in detail with particular reference to certain preferred embodiments thereof, but it will be understood that variations and modifications can be effected within the spirit and scope of the invention.

Parts List

20 Pixel
21a Gamut Subpixel
21b Gamut Subpixel
21c Gamut Subpixel
21d Within-Gamut Subpixel
22a Non-Microcavity Gamut Subpixel
22b Microcavity Gamut Subpixel
22c Microcavity Gamut Subpixel
22d Within-Gamut Subpixel
30a Light
30b Light
30c Light
30d Light
100 Substrate
110 Active Matrix Circuitry
111 Semiconductor Active Layer
112 Gate Dielectric
113 Gate Conductor
114 First Insulating Layer
115 Power Line
116 Signal Line
117 Second Insulating Layer
120a Semi-Transparent Reflector
120b Semi-Transparent Reflector
120c Semi-Transparent Reflector
130 Transparent Electrode
130a Transparent Electrode
130d Transparent Electrode
140a Transparent Cavity-Spacer Layer Parts List Cont'd
140b Transparent Cavity-Spacer Layer
150a Reflector
150b Reflector 150c Reflector
150d Reflector
160 Interpixel Dielectric
210 Hole Injecting Layer
212 Hole Transporting Layer
213 Light Emitting Layer
214 Electron Transporting Layer
220 Reflector
230 Semi-Transparent Reflector
240 Transparent Electrode
310 Color Filter

What is claimed is:

1. An OLED device comprising:
   (a) an array of light emitting pixels, each pixel including subpixels having organic layers including at least one emissive layer that produces light and spaced electrodes, and wherein there are at least three gamut subpixels that produce colors which define a color gamut and at least one subpixel that produces light within the color gamut produced by the gamut subpixels; and
   (b) wherein at least one of the gamut subpixels includes a reflector and a semitransparent reflector which function to form a microcavity and the within color gamut subpixel has a transparent electrode and does not form a microcavity.

2. The OLED device of claim 1 wherein the reflector also functions as an electrode for at least one of the subpixels.

3. The device of claim 1 wherein the semi-transparent reflector also functions as an electrode for one of more the subpixels.

4. The OLED device of claim 1 wherein the colors produced by the gamut subpixels are red, green and blue, and the color produced by the within color gamut subpixel is white.

5. The OLED device of claim 1, wherein the organic layers produce broadband emission and are common to all the subpixels of all the pixels.

6. The OLED device of claim 5, wherein at least one of the gamut subpixels further comprises a color filter element.

7. The OLED device of claim 1, wherein the device is a passive matrix device.

8. The OLED device of claim 1, wherein the device is an active matrix device.

9. The OLED device of claim 1, wherein the gamut subpixels having a microcavity structure further comprise a transparent cavity-spacer layer, wherein the thickness of the transparent cavity space layer, refractive index of the transparent cavity space layer, or both are separately adjusted for each different color gamut subpixel in conjunction with the thickness and refractive index of the organic layers for each gamut subpixel to tune the microcavity to the desired colors.

10. The OLED device of claim 9, wherein the transparent cavity spacer layer of one of the gamut subpixels is formed of the same material and thickness as the transparent electrode of at least one of the within color gamut subpixels.

11. The OLED device of claim 1, wherein the all but one of the gamut subpixels having a microcavity structure further comprise a transparent cavity-spacer layer, wherein the thickness of the transparent cavity space layer, refractive index of the transparent cavity space layer, or both are separately adjusted for each different color gamut subpixel in conjunction with the thickness and refractive index of the organic layers for each gamut subpixel to tune the microcavity to the desired color.

12. The OLED device of claim 11, wherein the transparent cavity spacer layer of one of the gamut subpixels is formed of the same material and thickness as the transparent electrode of at least one of the within color gamut subpixels.

13. The OLED device of claim 1, wherein one or more of the layers of the organic layer is separately patterned for one or more of the subpixels.

14. The OLED device of claim 13, wherein one or more of the layers of the organic layers is separately patterned for each of the gamut subpixels.

15. The OLED device of claim 13, wherein organic layers generates a broadband emission and all the layers of the organic layers are the same for one or more of the gamut subpixels and one or more of the within color gamut subpixels.

16. The OLED device of claim 1, wherein the device is bottom emitting.

17. The OLED device of claim 1, wherein the device is top emitting.

* * * * *